(12) United States Patent
Wu et al.

(10) Patent No.: US 6,693,834 B1
(45) Date of Patent: Feb. 17, 2004

(54) DEVICE AND METHOD FOR DETECTING ALIGNMENT OF BIT LINES AND BIT LINE CONTACTS IN DRAM DEVICES

(75) Inventors: Tie Jiang Wu, Ilan Hsien (TW); Chien-Chang Huang, Banchiau (TW); Yu-Wei Ting, Taipei (TW); Bo Ching Jiang, Hualien Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/448,727

(22) Filed: May 29, 2003

(30) Foreign Application Priority Data

Aug. 28, 2002 (TW) ........................................ 91119511 A

(51) Int. Cl.[7] ................................................ G11C 7/00
(52) U.S. Cl. .................. 365/201; 365/189.03; 438/462; 257/797
(58) Field of Search ........................... 365/201, 189.03; 438/462; 257/797

(56) References Cited

U.S. PATENT DOCUMENTS 6,529,427 B1 * 3/2003 Guo ........................... 365/201

2002/0142539 A1 * 10/2002 Tu et al. ...................... 438/239
2003/0003611 A1 * 1/2003 Weiner et al. ................ 438/16

* cited by examiner

Primary Examiner—Michael S. Lebentritt
Assistant Examiner—Toan Le
(74) Attorney, Agent, or Firm—Nelson A. Quintero

(57) ABSTRACT

A method and device for detecting alignment of bit lines and bit line contacts in DRAM devices. In the present invention, the test device is disposed in the scribe line region and is formed by the same masks and process as the bit lines and bit line contacts in the memory regions simultaneously. The memory deices and test may have the same alignment shift between bit line contacts and bit line due to use of the same masks and process. Thus, alignment of bit lines and bit line contacts in the memory region is determined according to two resistances (R1 and R2) detected by the test device. Further, the alignment shift can be obtained by $$\Delta W = R_{MO} \times L \times \left( \frac{1}{R_1} - \frac{1}{R_2} \right),$$

wherein $R_{MO}$ is the resistance per surface area of the bit lines, and L is the length of the bar-type bit line contacts in the test device.

15 Claims, 3 Drawing Sheets

DEVICE AND METHOD FOR DETECTING ALIGNMENT OF BIT LINES AND BIT LINE CONTACTS IN DRAM DEVICES

BACKGROUND OF THE INVENTION

1. Field of the Invention

The present invention relates to a test device, and in particular to a test device for detecting alignment of bit lines and bit line contacts in DRAM devices, as well as a test method thereof.

2. Description of the Related Art

FIG. 1a is a layout of conventional deep trench capacitors in a memory device. Deep trench capacitors 10 are disposed under the passing word lines. Transistors 14 are electrically coupled to the storage nodes 16 of the capacitors 10 through the diffusion regions 18. The diffusion regions 20 are connected to plugs 22 coupled to bit lines (not shown). The transistors 14 are driven by word lines 12, and the channels under the word lines 12 are conductive when appropriate voltages are applied to the word lines 12. Consequently, the current produced between the diffusion regions 18 and 20 may flow into or out of the storage nodes 16.

FIG. 1b is a cross-section of FIG. 1a. After the deep trench capacitors 10 are completely formed in the substrate, trench isolations are formed in the substrate and deep trench capacitors 10 to define active areas. The word lines 12 are then formed on the substrate, the diffusion regions 18 and 20 are formed in the active areas by word lines 12 during the implant process, and the diffusion regions 18 and 20 are located on both sides of the word lines 12. Finally, the plugs 22 are formed on the diffusions 20. The adjacent memory cells may experience current leakage and cell failure, reducing process yield, if bit line masks and contacts are not aligned accurately.

Therefore, the process yield and reliability of the memory cells can be improved if alignment inaccuracy between the masks of active areas and the deep trench capacitors is controlled within an acceptable range.

SUMMARY OF THE INVENTION

Accordingly, an object of the invention is to detect alignment of bit lines and bit line contacts in DRAM devices.

According to the above mentioned objects, the present invention provides a test device for detecting alignment of bit lines and bit line contacts in DRAM devices.

In the test device of the present invention, an active area is disposed in the scribe line area. Parallel first and second bar-type bit line contacts are disposed in the active area. The first and second bar-type bit line contacts are shorter than the active area, and each bar-type line contact has an outside surface and two terminals. First and second bit lines are disposed in the active area, the first bar-type bit line contact is covered by the first bit line with a first outside surface aligned with the outside surface of the first bar-type contact. The second bar-type bit line contact is covered by the second bit line with a second outside surface aligned with the outside surface of the second bar-type contact. First and second plugs are disposed on the two terminals of the first bit line respectively. Third and fourth plugs are disposed on the two terminals of the second bit line respectively.

According to the above mentioned objects, the present invention also provides a method for detecting alignment of bit lines and bit line contacts in DRAM devices.

In the method of the present invention, a wafer with at least one scribe line region and at least one memory region is provided. A plurality of memory cells in the memory region and at least one test device in the scribe line region are formed simultaneously, wherein the memory region has bit line contacts and bit lines. A first resistance is detected by the first plug and the second plug, and the second resistance is detected by the third plug and the fourth plug, respectively. Alignment of the bar-type bit line contacts and the bit lines of the test device is determined according to the first resistance and the second resistance. Finally, alignment of the bit line contacts and the bit lines is determined according to alignment of the bar-type bit line contacts and bit lines of the test device.

A detailed description is given in the following embodiments with reference to the accompanying drawings.

DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 2:
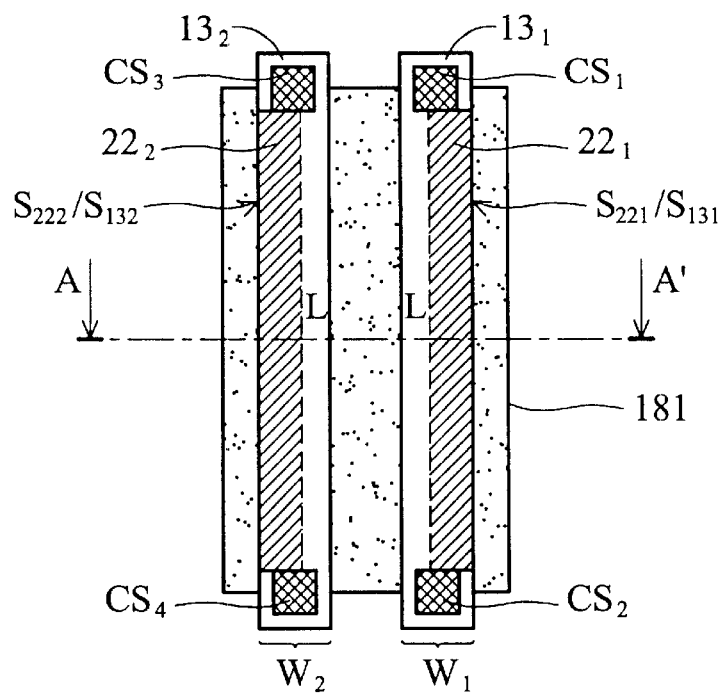
FIG. 2 is a layout of the test device according to the present invention.
Figure 3:
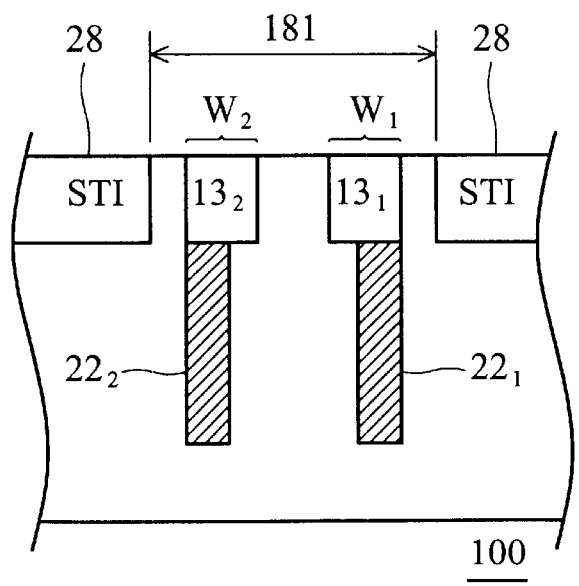
FIG. 3 is a cross section of FIG. 2 according to the present invention.

FIG. 2 is a layout of the test device according to the present invention, and FIG. 3 is a cross section of FIG. 2. The test device detects whether the alignment of bit lines and bit line contacts in DRAM devices, wherein at least one test device is disposed a scribe line region 160 of a wafer 100.

An active area 181 is defined in the scribe line region of the wafer by trench isolation, wherein the active area 181 has a width about 2 micrometers and a length of about 300 micrometers.

First and second bar-type bit line contacts $22_1$ and $22_2$ are parallel to each other and disposed in the active area 181. The first and second bar-type bit line contacts $22_1$ and $22_2$ are shorter than the active area 181. In this case, length L of the first and second bar-type bit line contacts $22_1$ and $22_2$ is about 290 micrometers and the width of the first and second bar-type bit line contacts $22_1$ and $22_2$ is about 0.2 micrometers. In addition, the first bar-type line contact $22_1$ and the second bar-type contact $22_2$ have outside surfaces $S_{221}$ and $S_{222}$, respectively, are made of, for example, polysilicon.

First and second bit lines are disposed in the active area 181, wherein the first bar-type bit line contact $22_1$ is covered by the first bit line $13_1$. The first bit line $13_1$ has a first outside surface $S_{131}$ aligned with the outside surface $S_{221}$ of the first bar-type contact $22_1$. The second bar-type bit line contact $22_2$ is covered by the second bit line $13_2$. The second bit line $13_2$ has a second outside surface $S_{132}$ aligned with the outside surface $S_{222}$ of the second bar-type contact 222. Bit lines $13_1$ and $13_2$ are longer than bar-type bit line contacts $22_1$ and $22_2$ and the active area. For example, the bit lines $13_1$ and $13_2$ may have length of about 310 micrometers and width ($W_1$ and $W_2$) of about 0.5 micrometers, and the bit lines $13_1$ and $13_2$ are made of tungsten.

In addition, first and second plugs $CS_1$ and $CS_2$ are disposed on the two terminals of the first bit line $13_1$ respectively and third and fourth plugs $CS_3$ and $CS_4$ are disposed on the two terminals of the second bit line $13_2$ respectively.

Usually, a first resistance $R_1$ can be determined by the first and second plugs $CS_1$ and $CS_2$, and a second resistance $R_2$ can be determined by the third and fourth plugs $CS_3$ and $CS_4$. The first resistance $R_1$ and the second resistance $R_2$ can be presented by equations 1 and 2 respectively.

$$R_1 = R_{MO} \times \frac{L}{W_1} \qquad (1)$$

$$R_2 = R_{MO} \times \frac{L}{W_2} \qquad (2)$$

Equations 3 and 4 are obtained according to the equations 1 and 2 respectively.

$$W_1 = \frac{R_{MO} \times L}{R_1} \qquad (3)$$

$$W_2 = \frac{R_{MO} \times L}{R_2} \qquad (4)$$

Because the first bit line $13_1$ and second bit line $13_2$ are formed in the same process with the same conditions and parameters, the resistances per surface area of the first and second bit lines $13_1$ and $13_2$ are both $R_{MO}$. Also, the lengths of the first and second bar-type bit line contacts $22_1$ and $22_2$ are both L. Equation 5 is obtained by substituting equations 3 and 4.

$$\Delta W = W_1 - W_2 = \frac{R_{MO} \times L}{R_1} - \frac{R_{MO} \times L}{R_2} = R_{MO} \times L \times \left( \frac{1}{R_1} - \frac{1}{R_2} \right) \qquad (5)$$

Therefore, the alignment shift $\Delta W$ between first and second bar-type bit line contacts ($22_1$ and $22_2$) and the first and second bit lines ($13_1$ and $13_2$) can be obtained if the first resistance $R_1$ and the second resistance $R_2$ are detected. That is to say, the alignment shift $\Delta W$ between first and second bar-type bit line contacts ($22_1$ and $22_2$) and the first and second bit lines ($13_1$ and $13_2$) when the first resistance $R_1$ equals the second resistance $R_2$.

Figure 4:
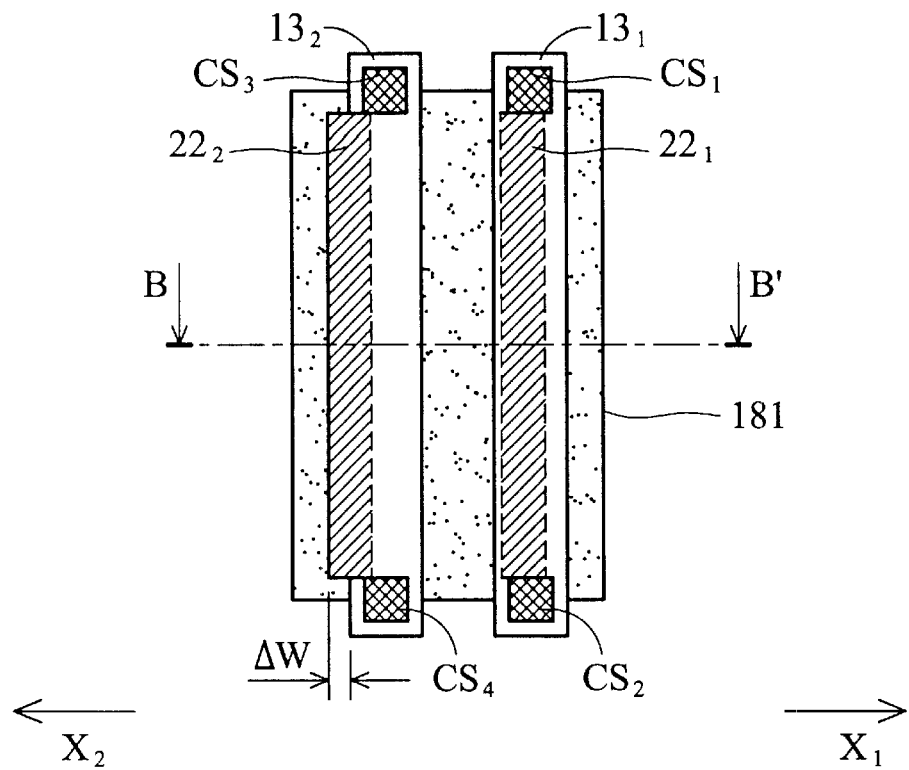
FIG. 4 is a layout of the test device with alignment shift according to the present invention.
Figure 5:
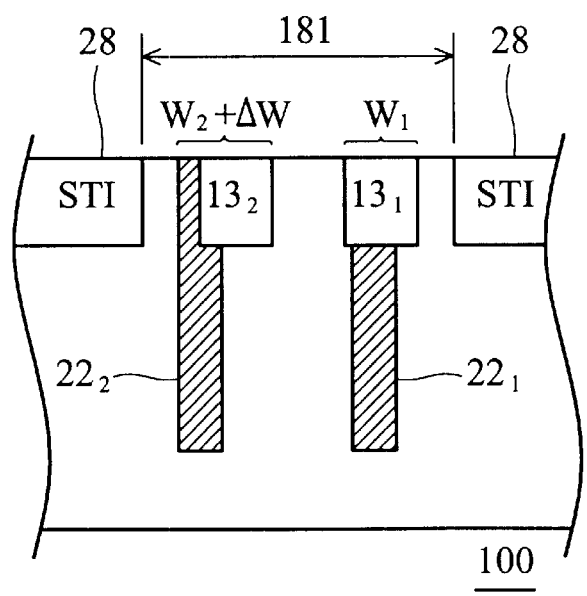
FIG. 5 is a cross section of FIG. 4.

For example, with reference to FIG. 4 and FIG. 5, the bit lines $13_1$ and $13_2$ are shifted by a distance $\Delta W$ along the direction $X_1$ if the masks of the bit lines ($13_1$ and $13_2$) and the bar-type bit line contacts ($22_1$ and $22_2$) have an alignment shift in the direction $X_1$. If this condition is met, the second outside surface $S_{132}$ of the second bit line $13_2$ may not align with the outside surface $S_{222}$ of the second bar-type bit line contact $22_2$. The second bar-type bit line contact $22_2$ is not covered by the second bit line $13_2$ completely, and the portion with width $\Delta W$ is exposed. The first bar-type bit line contact $22_2$ is covered by the first bit line $13_1$ completely, even though the first bit line $13_1$ has been shifted by a distance $\Delta W$. Thus, the equivalent width of the second bit line $13_2$ is increased to $W_2+\Delta W$, but that of the first bit line $13_1$ is still $W_1$. Resistance is inversely proportional to the cross section of the conductor, and the cross section of the conductor can be regarded as a product of width and length of the conductor. In the present invention, the lengths of the bit lines $13_1$ and $13_2$ are equal, and the lengths of the bar-type bit line contacts $22_1$ and $22_2$ are equal. Thus, in the present invention, resistance is inversely proportional to equivalent width of conductor. In this condition, the first resistance $R_1$ detected by the first and second plugs ($CS_1$ and $CS_2$) is larger than the second resistance $R_2$ detected by the third and fourth plugs ($CS_3$ and $CS_4$), and further, the alignment shift can be obtained by the equation 5.

On the contrary, the bit lines $13_1$ and $13_2$ are shifted by a distance $\Delta W$ along the direction $X_2$ (not shown in FIG. 4 and FIG. 5) if the masks of the bit lines ($13_1$ and $13_2$) and the bar-type bit line contacts ($22_1$ and $22_2$) have an alignment shift in the direction $X_2$. If this condition is met, the first outside surface $S_{131}$ of the first bit line $13_1$ may not align with the outside surface $S_{221}$ of the first bar-type bit line contact $22_1$. The first bar-type bit line contact $22_1$ is not covered by the first bit line $13_1$ completely, and the portion with width $\Delta W$ is exposed. The second bar-type bit line contact $22_1$ is covered by the second bit line $13_2$ completely, even though the second bit line $13_2$ has been shifted by a distance W. Thus, the equivalent width of the first bit line $13_1$ is increased to $W_1+\Delta W$, but that of the second bit line $13_2$ is still $W_2$. In the present invention, resistance is inversely proportional to equivalent width of conductor. Thus, in this condition, the first resistance $R_1$ detected by the first and second plugs ($CS_1$ and $CS_2$) is smaller than the second resistance $R_2$ detected by the third and fourth plugs ($CS_3$ and $CS_4$), and the alignment shift $\Delta W$ can be obtained by the equation 5.

The present invention also provides a method for detecting alignment of bit lines and bit line contacts in DRAM device. In the method of the present invention, a wafer with at least one scribe line area and at least one memory region is provided (not shown).

Figure 1A:
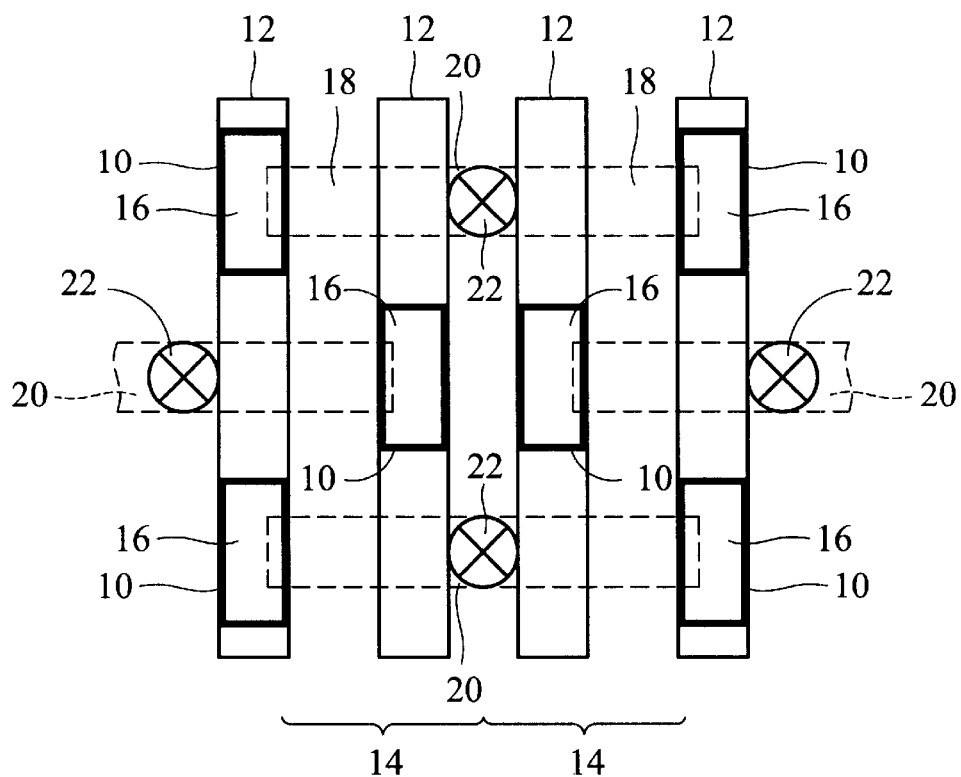
FIGS. 1a and 1b are layouts of a conventional memory device with deep trench capacitors.
Figure 1B:
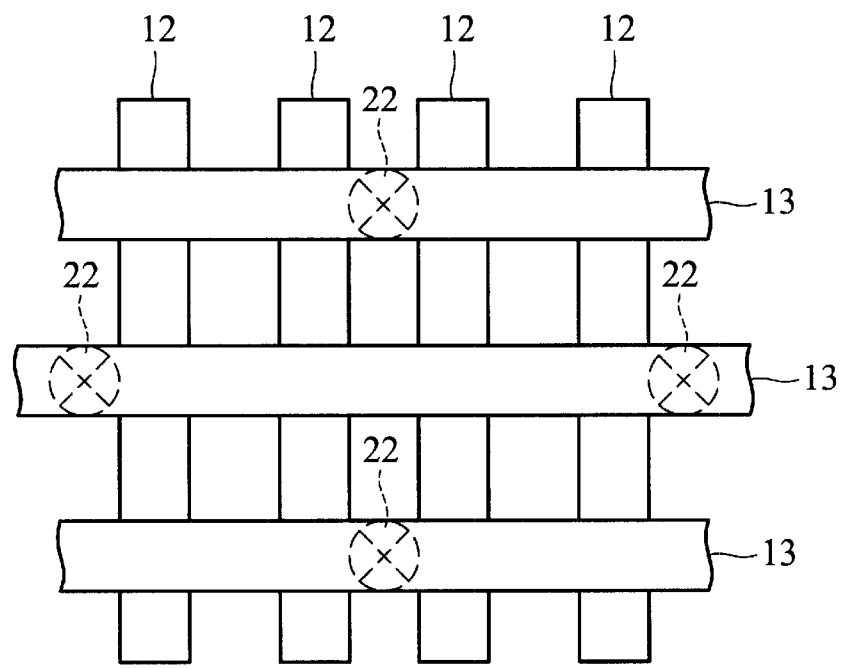

A plurality of memory cells in the memory region and at least one test device in the scribe line area are formed simultaneously, wherein the memory regions have bit lines and bit line contacts as shown in FIGS. 1a and 1b. The structure of the test device is shown in FIG. 2 and FIG. 3. The bit line contacts in the memory regions and the bar-type bit line contacts in the test device are formed by the same mask and the same process. The bit lines in the memory regions and first and second bit lines in the test device are formed by the same mask and the same process.

After that, the first resistance $R_1$ is detected by the first plug $CS_1$ and the second plug $CS_2$ in the test device, and the second resistance $R_2$ is detected by the third plug $CS_3$ and the fourth plug $CS_4$ in the test device. Alignment of the bit lines ($13_1$ and $13_2$) and the bar-type bit line contacts ($22_1$ and $22_2$) of the test device is determined according to whether the first resistance $R_1$ is equal to the second resistance $R_2$.

The memory regions and the test device may have the same alignment shift between the bit line contacts and bit lines due to use of the same masks and the same process. Thus, alignment of bit lines and bit line contacts in memory regions can be obtained according to alignment of bar-type bit line contacts ($22_1$ and $22_2$) and bit lines ($13_1$ and $13_2$) of the test device. The alignment shift between bit lines and the bit line contacts in the memory regions can also be obtained according to the equation 5.

In the present invention, the test device is disposed in the scribe line region and is formed by the same masks and process as the bit lines and bit line contacts in the memory regions simultaneously. Therefore, the test device disposed in the scribe line region can detect the alignment shift between the bit lines and bit line contacts in the memory regions because the test device and the memory regions may have the same alignment shift when masks are aligned. Further, in the present invention the test device is disposed in the scribe line region to avoid occupying layout space in memory regions.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A test device for detecting alignment of bit lines and bit line contacts in DRAM devices, wherein the test device is disposed in a scribe line region of a wafer, comprising:

an active area disposed in the scribe line area;

parallel first and second bar-type bit line contacts, disposed in the active area, wherein the first and second bar-type bit line contacts are shorter than the active area, and each bar-type line contact has an outside surface and two terminals;

first and second bit lines disposed in the active area, wherein the first bar-type bit line contact is covered by the first bit line with a first outside surface aligned with the outside surface of the first bar-type contact, and the second bar-type bit line contact is covered by the second bit line with a second outside surface aligned with the outside surface of the second bar-type contact;

first and second plugs disposed on the two terminals of the first bit line respectively; and third and fourth plugs disposed on the two terminals of the second bit line respectively.

2. The test device as claimed in claim 1, wherein a first resistance is detected by the first and second plugs, and a second resistance is detected by the third and fourth plugs.

3. The test device as claimed in claim 1, wherein the first bar-type bit line contact and second bar-type bit line contact have the same width.

4. The test device as claimed in claim 1, wherein the first and second bit lines have the same width and are longer than the widths of the first and second bar-type bit line contacts.

5. The test device as claimed in claim 1, wherein the first and second bit lines are longer than the first bar-type bit line contact and the active area.

6. The test device as claimed in claim 2, wherein the alignment of the bit line contact and the bar-type active area is abnormal when the first resistance is not equal to the second resistance.

7. The test device as claimed in claim 1, wherein the first and second bit lines are made of tungsten.

8. The test device as claimed in claim 1, wherein the first and second bar-type bit line contacts are made of polysilicon.

9. A method for detecting alignment of bit lines and bit line contacts in DRAM devices, comprising:

providing a wafer with at least one scribe line and at least one memory region;

forming a plurality of memory cells in the memory region and at least one test device in the scribe line simultaneously, wherein the memory region has bit line contacts and bit lines, the test device including:

an active area disposed in the scribe line area;

parallel first and second bar-type bit line contacts, disposed in the active area, wherein the first and second bar-type bit line contacts are shorter than the active area, and each bar-type line contact has an outside surface and two terminals;

first and second bit lines disposed in the active area, wherein the first bar-type bit line contact is covered by the first bit line with a first outside surface aligned with the outside surface of the first bar-type contact, and the second bar-type bit line contact is covered by the second bit line with a second outside surface aligned with the outside surface of the second bar-type contact;

first and second plugs disposed on the two terminals of the first bit line respectively; and third and fourth plugs disposed on the two terminals of the second bit line respectively;

detection of a first resistance by the first and second plugs;

detection of a second resistance by the third and fourth plugs;

determining alignment of the first and second bit lines and the first and second bar-type bit line contacts of the test device according to the first resistance and the second resistance; and determining alignment of the bit line contacts and the bit lines in the memory regions according to alignment of the bar-type bit line contacts and bit lines of the test device.

10. The method as claimed in claim 9, wherein the first bar-type bit line contact and second bar-type bit line contact have the same width.

11. The method as claimed in claim 9, wherein the first and second bit lines have the same width and are longer than the width of the first and second bar-type bit line contacts.

12. The method as claimed in claim 9, wherein the first and second bit lines are longer than the first bar-type bit line contact and the active area, and the first and second bit lines have the same resistance per surface area.

13. The method as claimed in claim 9, wherein the alignment of the bit line contact and the bar-type active area is determined to be abnormal when the first resistance is not equal to the second resistance.

14. The method as claimed in claim 12, further comprising a step of determining alignment shift of the bit line contacts and the bit lines according to the first resistance, the second resistance, the length of the first and second bar-type bit line contacts and the resistance per surface area of the first and second bit lines.

15. The method as claimed in claim 14, wherein the alignment shift ($\Delta W$) is determined by an equation:

$$\Delta W = R_{MO} \times L \times \left( \frac{1}{R_1} - \frac{1}{R_2} \right);$$

wherein RMO is the resistance per surface area of the first and second bit lines, L is the length of the first and second bar-type bit line contacts, R1 is the first resistance, and R2 is the second resistance.

* * * * *